(12) United States Patent
Walker

(10) Patent No.: US 6,207,985 B1
(45) Date of Patent: Mar. 27, 2001

(54) DRAM MEMORY CELL AND ARRAY HAVING PASS TRANSISTORS WITH SURROUNDING GATE

(75) Inventor: Darryl Walker, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/241,269

(22) Filed: Feb. 1, 1999

Related U.S. Application Data
(60) Provisional application No. 60/073,444, filed on Feb. 2, 1998.

(51) Int. Cl.$^7$ .................. H01L 27/108; H01L 31/119
(52) U.S. Cl. ................ 257/296; 257/401; 257/623; 257/306
(58) Field of Search .................. 438/164; 257/66, 257/67, 68, 71, 277, 278, 286, 296, 297, 300, 306, 315, 347, 349, 353, 369, 382, 401, 512, 623, 624, 625, 626

(56) References Cited

U.S. PATENT DOCUMENTS

| | | | |
|---|---|---|---|
| H1435 | * | 5/1995 | Cherne et al. ............. 257/347 |
| 5,079,604 | * | 1/1992 | Houston et al. ............. 357/237 |
| 5,652,453 | * | 7/1997 | Iwamatsu et al. ............. 257/347 |
| 6,018,177 | * | 1/2000 | Chi ............. 257/303 |
| 6,121,650 | * | 9/2000 | Akamatsu ............. 257/296 |
| 6,121,651 | * | 9/2000 | Furukawa et al. ............. 257/296 |

OTHER PUBLICATIONS

Hisamoto et al., "A Fully Depleted Lean–channel Transistor(DELTA)—A novel vertical ultra thin SOI MOSFET—", *IEDM 89*, pp. 34.5.1–34.5.4, 1989.

* cited by examiner

*Primary Examiner*—Olik Chaudhuri
*Assistant Examiner*—Ginette Peralta
(74) *Attorney, Agent, or Firm*—Bradley T. Sako

(57) ABSTRACT

A dynamic random access memory (DRAM) cell and associated array are disclosed. In a first embodiment, the DRAM (300) includes a storage capacitor (308) and a pass transistor (306). The pass transistor (306) is formed within a silicon mesa (314), and includes a source region (320), a drain region (322), and a channel region (324) that extends in a length direction between the source region (320) and drain region (322). When viewed with respect to a width direction, the channel region (324) has a narrower width than that of the source region (320) and drain region (322). Further, the channel region (324) has a top surface and opposing side surfaces. A surrounding gate (318) is disposed around the channel region (324), adjacent to the top and side surfaces, and separated therefrom by a gate insulating layer (316). Due to the reduced channel region width and surrounding gate (318), greater control of the operation of the pass transistor (302) is provided, including an off state with reduced source-to-drain leakage.

35 Claims, 6 Drawing Sheets

DRAM MEMORY CELL AND ARRAY HAVING PASS TRANSISTORS WITH SURROUNDING GATE

This application claims benefit of U.S. provisional application serial No. 60/073,444 filed Feb. 02, 1998.

TECHNICAL FIELD

The present invention relates generally to semiconductor devices, and more particularly to dynamic random access memory (DRAM) storage cells and arrays.

BACKGROUND OF THE INVENTION

As the complexity and power of computing systems increases, the amount of memory required for systems has also increased. This has resulted in the drive for semiconductor memory devices of increased storage capacity. At the same time, the desire for more efficient manufacturing and more compact electronic devices has led to the competing interest of shrinking semiconductor memory devices to as small a size as possible. As a result, there is a continuous drive to arrive at semiconductor memory devices which have as high a density (data bits per physical area) as possible.

A common type of semiconductor memory device is the dynamic random access; memory (DRAM). DRAMs typically include a large number (millions or thousands) of memory cells, each of which can store at least one bit of data. The memory cells are usually arranged into an array configuration of rows and columns. Because the primary function of DRAM is to store data, the DRAM array makes up the majority of the area on a DRAM. Thus, any reduction in the size of a memory cell translates into increased memory density.

While density is an important features of a DRAM, another factor, speed, is also important. One reason for the increase in system computing power is the faster speeds at which such systems operate. For this reason, it is also desirable to provide a DRAM that has a fast operating speed, so that data can be provided to a system at a sufficient rate.

DRAMs are a preferred choice for main system memory as they are typically less costly than other memory types and consume relatively low amounts of power. However, because DRAMs are being used more often in battery operated applications, such as laptop computers, further improvements in power consumption are desirable. Lower power DRAMs can contribute to longer battery lifetimes in battery operated systems.

To better understand the factors involved in DRAM design that impact memory device density, speed and power consumption, the architecture of a conventional DRAM memory array will be reviewed. A typical DRAM array includes memory cells arranged in row and columns, with the memory cells of the same row being commonly coupled to a word line and the memory cells of the same column being commonly coupled to a bit line.

The data stored within the memory cells is accessed according to various DRAM operations which include read operations, write operations and refresh operations. Read and write operations usually begin with the application of an external memory address. Commonly, an applied memory address is multiplexed, with a row address being applied first, and a column address being applied subsequently. The application of the row address results in the activation of a word line. Once activated, the word line couples the data stored within its respective row to the bit lines of the array. The coupling of a row of memory cells to bit lines results in differential voltage signals appearing on the bit lines (or bit line pairs). The differential signals are relatively small, and so must be amplified (typically by a sense amplifier). The application of the column address activates column decoder circuits, which connect a given group of bit lines to input/output circuits.

Referring now to FIG. 1, a prior DRAM array is set forth and designated by the general reference character 100. The DRAM array 100 is arranged as an n×m array, having n rows coupled to n word lines (WL0–WLn) and m columns coupled to m sets of bit line pairs (BL0, BL0_–BLm, BLm_). A memory cell is formed where a word line intersects a bit line pair. The memory cells are designated as M00–Mnm, where the first digit following the "M" represents the physical row of the memory cell's location and the second digit represents the physical column of the memory cell's location. For example, M00 is the memory cell located at the intersection of WL0 and bit line pair BL0/BL0_.

The word lines of the DRAM array 100 are driven by a word line driver bank 102 coupled to the word lines (WL0–WLn). The word line driver bank 102 is separated into n separate word line driver circuits, shown as DRV0–DRVn. The word line driver bank 102 is responsive to a row address (not shown) in such a manner that only one word line driver circuit (DRV0–DRVn) will drive its corresponding word line high, when the row address is received. For example, word line driver circuit DRV0 will drive word line WL0 high when the row address value of "zero" is received, and word line driver circuit DRVn will drive word line WLn high when the row address value of "n" is received.

The DRAM array 100 further includes a sense amplifier bank 104 coupled to the bit line pairs (BL0, BL0_–BLm, BLm_). The sense amplifier bank 104 is separated into m separate sense amplifier circuits, shown as SA0–SAm. While all of the sense amplifiers 104 will be activated simultaneously, only selected of the sense amplifiers (SA0–SAm) will pass sensed data to the DRAM outputs (not shown). A sense amplifier (SA0–SAm) will be selected according to a column address applied to a column decoder (not shown) in the DRAM.

The typical DRAM memory cell stores data by placing charge on, or removing charge from, a storage capacitor. Once a storage capacitor has been initially charged, over time, the amount of charge will be reduced by way of a leakage current. Thus, it is important for the DRAM to restore the charge on the capacitor before the amount of charge falls below a critical level, due to leakage mechanisms. The critical level of charge for a storage capacitor arises out of the minimum sensitivity of the DRAM sense amplifiers. The storage capacitor must have enough charge to create a sufficient differential voltage on the bit lines for the sense amplifier to reliably sense. The time needed before the charge on the capacitor falls below the critical level is commonly referred to as the maximum "pause" period.

Typically, the restoration of charge within a DRAM memory cell is accomplished with a refresh operation. Thus, a DRAM should perform a refresh operation on every row in the device before that row experiences the maximum "pause" period. The refreshing operation of a DRAM is considered important as such operations consume a relatively large amount of power because all the bit lines in an array must be driven to refresh the memory cells in a row. One way to reduce power consumption in a DRAM, therefore, is to reduce the rate of charge leakage from the storage capacitor. By doing so, the maximum pause period of the DRAM can be increased, allowing refresh operations to occur with less frequency.

Referring once again to FIG. 1, each memory cell (M00–Mnm) of the DRAM array 100 is shown to contain a pass transistor (shown as n-channel MOSFETs Q00–Qnm) and a storage capacitor (shown as C00–Cnm). Within each memory cell (M00–Mnm) the junction of the source of the each storage capacitor (C00–Cnm) and its associated pass transistor (Q00–Qnm) is shown as a storage node (106–112). The potential at the storage node will determine the logic of the data stored within the memory cell. Thus, a memory cell (M00–Mnm) is accessed in a read, write and refresh operation by coupling its storage node (106–112) to its respective bit line (BL0, BL0_–BLm, BLm_.

In a read cycle, the bit line pairs (BL0, BL0_–BLm, BLm_) are initially at a precharge potential. This potential is typically midway between a logic high and logic low. Thus, assuming Vss=0 volts, the bit lines would be precharged to Vcc/2. The read cycle begins with a row address being applied to the DRAM to activate a word line. The pass transistors in a row of memory cells are turned on, coupling their storage nodes to their respective bit lines (BL0, BL0_–BLm, BLm_. In order to ensure that maximum charge is placed on the bit lines, the selected word line driver circuit will drive its word line to a voltage level that is at least one n-channel threshold voltage (Vtn) above the high logic level of the array (Vcc). The speed of a DRAM is thus dependent upon how fast a word line can be driven from a low potential to a high potential.

Referring once again to FIG. 1, each word line is shown to be coupled to the control gate of all the DRAM cells within its particular row. This arrangement results in a relatively large capacitive load on the word line. In order to reduce the speed required to drive the word line between high and low voltages, it is desirable to make the word line have as little resistance as possible. The polysilicon word line resistance may be reduced by forming a self-aligned silicide (salicide) structure on it. Alternatively, a metal layer may run parallel to and over the polysilicon, and be periodically connected to the polysilicon by way of contacts. Such a structure is often referred to as a "strapped" word line.

When the memory cells of a selected row are coupled to their bit lines, a differential voltage will be generated across the bit line pairs (BL0, BL0_–BLm, BLm_. The value of the differential voltage is dependent upon the logic of the data stored in the memory cell. For example, if it is assumed that memory cell M00 stores a logic "1," capacitor C00 will be charged. Thus, when the data from memory cell M00 is read, bit line BL0 will rise to a potential that is a slightly higher than the potential of bit line BL0_ (which is at Vcc/2). Conversely, if it is assumed that memory cell M00 stores a logic "0," capacitor C00 will be discharged, and when memory cell M00 is read, bit line BL0 will fall to a potential that is a slightly less than that of bit line BL0_ (Vcc/2).

Once differential voltages are established on the bit line pairs (BL0, BL0_–BLm, BLm_) the sense amplifier bank 104 is activated. When activated, the sense amplifiers (SA0–SAm) amplify the voltage differential on the bit lines pairs (BL0, BL0_–BLm, BLm_), to generate data signals having a full logic level (either Vcc or Vss, depending upon the logic level stored in the memory cell). For example, in the event memory cell M00 stored a logic 1, sense amplifier SA0 would drive bit line BL0 to Vcc and bit line BL0_ to Vss. In the case of logic 0, bit line BL0 would be driven to Vss while bit line BL0_ is driven to Vcc.

Because the pass transistors coupled to word line WL0 are still turned on when the differential voltage signals are amplified, fill logic levels will be applied to the bit line pair; (BL0, BL0_ to BLm, BLm_) according to the values originally store therein. Following the same example, if memory cell M00 stores a logic "1", with word line WL0 at a voltage of Vcc+Vtn, a full Vcc level will be applied back to the storage node 106, recharging capacitor C00. In the event of a logic 0, storage node 106 will be discharged to Vss. In this manner, all of the memory cells in an row will have their data restored to a full logic level (Vcc or Vss) by a read operation.

Refresh operations occur in the same fashion as a read cycle, except that the selection of a row is usually accomplished by a counter circuit. Further, the amplified bit line data is not provided as output data.

Write operations occur in a similar fashion to read operations. A row address results in the activation of a word line. A column address will couple write circuitry (not shown) to selected bit lines, to allow high or low logic levels (Vcc or Vss) to be written into selected memory cells. In order to ensure maximum charge is placed on the storage capacitor, the activated word line is driven to one Vt above Vcc, as in the read and refresh operations.

Following a read, write, or refresh operation, the DRAM is allowed to go into a precharge state, in which the word lines will be driven to a low voltage, for example Vss. In this state, the storage nodes (106–112) are isolated from the bit lines (BL0, BL0_–BLm, BLm_), as the pass transistors (Q00–Qnm) will be in a non-conducting state. Because the leakage characteristics of the storage capacitors (C00–Cnm) and pass transistor Q00 are not ideal, once the storage nodes (106–112) are isolated from the bit lines (BL0, BL0_–BLm, BLm_) the charge stored on the storage capacitors (C00–Cnm) will leak away, and the voltage will slowly begin to fall.

As mentioned above, a read or refresh operation must be performed on each row in the DRAM before the charge level on the storage node 106 falls below the critical level. Thus, it is important to make the pass transistors (Q00–Qnm) and storage capacitors (C00–Cnm) as ideal (i.e., have as little leakage) as possible.

The critical charge level of DRAM memory cell storage capacitors is dependent upon the capacitance of the storage capacitor: The larger the capacitance, the greater the amount of charge that can be stored on the capacitor. Having more charge on the capacitor results in more charge that can be lost before the total charge on the capacitor falls below the critical level. Thus, it is important to construct storage capacitor having as large a capacitance as possible. While the capacitance of a storage capacitor can be increased by physically increasing the size of the capacitor, a drawback to such an approach is that other array structures may place constraints on how far the storage capacitor may extend, both laterally and vertically. Furthermore, increasing the size of the storage capacitor will result in a larger array size.

To better understand the constraints imposed on conventional DRAM cells, a side cross sectional view of a memory cell is set forth in FIG. 2. The memory cell is designated by the general reference character 200, and shown to include a pass transistor 202 and a storage capacitor 204 formed on a semiconductor substrate 206. The pass transistor 202 couples the storage capacitor 204 to a bit line 208 in order to allow data to be read from, written to, or refreshed within, the memory cell 200.

The storage capacitor 204 includes a storage node 210 and a top plate 212 separated by a capacitor dielectric 214. The storage node 210 is formed from polysilicon and is coupled to the pass transistor 202. The capacitor dielectric 214 may be silicon dioxide or a silicon dioxide-silicon nitride-silicon dioxide ($SiO_2$—$Si_3N_4$—$SiO_2$) combination. The top plate 212 is formed from polysilicon, and all storage cells on the DRAM array may share the same top plate 212. The top plate 212 may be maintained at a "plate" voltage having a potential equivalent to Vcc/2 that serves to reduce the electric field across the capacitor dielectric 214. The capacitance of the storage capacitor 204 is determined by the surface area of the storage node 210, the dielectric constant of the capacitor dielectric 214, and the thickness of the capacitor dielectric 214 (the distance between the top plate 212 and the storage node 210).

The pass transistor 202 is shown to include a source region 216 and a drain region 218 formed within the substrate 206. The substrate 206 is P-type doped silicon and the source region 216 and drain region 218 are N-type doped silicon. The P-N junction created between the substrate 206 and the source and drain regions (216 and 218) generates a parasitic junction capacitance which limits the performance of the pass transistor 202. The pass transistor 202 also includes a control gate 220 placed between the source region 216 and drain region 218, and separated from the substrate 206 by a thin control dielectric 222. The control gate 220 is polysilicon, and the thin control dielectric 222 may be silicon dioxide, or a combination silicon dioxide-nitride layer.

The pass transistor 202 is coupled to the storage capacitor 204 at the drain region 218. The pass transistor 202 is further coupled to a bit line contact 224 via the source region 216. The bit line contact 224 is coupled to the bit line 208. The bit line 208 is a metal, for example Al, or alternatively, a titanium-tungsten combination (TiW). In operation, when the control gate 220 is at a voltage that is one Vtn above that of the source region 216 or drain region 218, a low impedance path is formed between the storage node 210 and the bit line 208. In this manner, data can be read from, written to, or restored at, the storage node 210. However, if the control gate 220 voltage is less than one Vtn above the source region 216 and drain region 218, the pass transistor 202 forms a high impedance path between the storage capacitor 204 and the bit line 208. In this manner, a low voltage on the control gate 220 (such as Vss) results in the isolation of the bit line 208 from storage node 210, and only unwanted leakage mechanisms may interfere with the data integrity.

One type of unwanted leakage mechanism is current that leaks from the drain region 218 to the source region 216 within the pass transistor 202. This current is represented by the character "Ileak" in FIG. 2. The current Ileak can be problematic, due to short channel effects resulting from a very short channel length. This raises a barrier to the limit to which transistor dimensions can be shrunk, which in turn, places a limitation on how small a DRAM array can be. Short channel effects will further effect the reliability of adjusting the threshold voltage of the pass transistor 202. Because the operation of the pass transistor 202 is dependent upon its threshold, it would be desirable to have greater control over the channel region of the pass transistor 202. It is understood that in an array configuration, the control gate 220 runs the full length of the DRAM array in the row direction, forming the word line, such as WL0 set forth in FIG. 1.

As device geometries continue to shrink, it would be desirable to arrive at a DRAM memory cell that has small feature sizes (such as short channel lengths), greater control over the channel region, a high capacitance storage capacitor, low parasitic capacitance, and greater control over the channel region. Such DRAM cell would preferably be implemented in a high-density memory array.

SUMMARY OF THE INVENTION

According to the present invention, a dynamic random access memory (DRAM) cell includes a pass transistor and a charge storage device. The pass transistor is formed on an epitaxially grown silicon mesa that includes a source region separated from a drain region by a channel region. The channel region extends in a length direction between the source region and drain region, and in a width direction that is generally perpendicular to the length direction. The channel region is smaller in width direction than the source region and drain region. Further, the control gate for the pass transistor surrounds the channel region on three sides. The narrow width of the channel region and surrounding control gate provide greater control over the channel region, resulting in advantageous charge storage capabilities.

DETAILED DESCRIPTION OF THE EMBODIMENTS

The preferred embodiment is a novel dynamic random access memory (DRAM) cell, and a DRAM array configuration that employs the novel memory cell. The preferred embodiment includes a memory cell having a pass transistor with reduced feature size, greater channel control arising out of a surrounding gate structure, and reduced parasitic capacitance. Furthermore, the preferred embodiment memory cell can be implemented in a DRAM array to provide a dense array configuration.

Figure 3A:
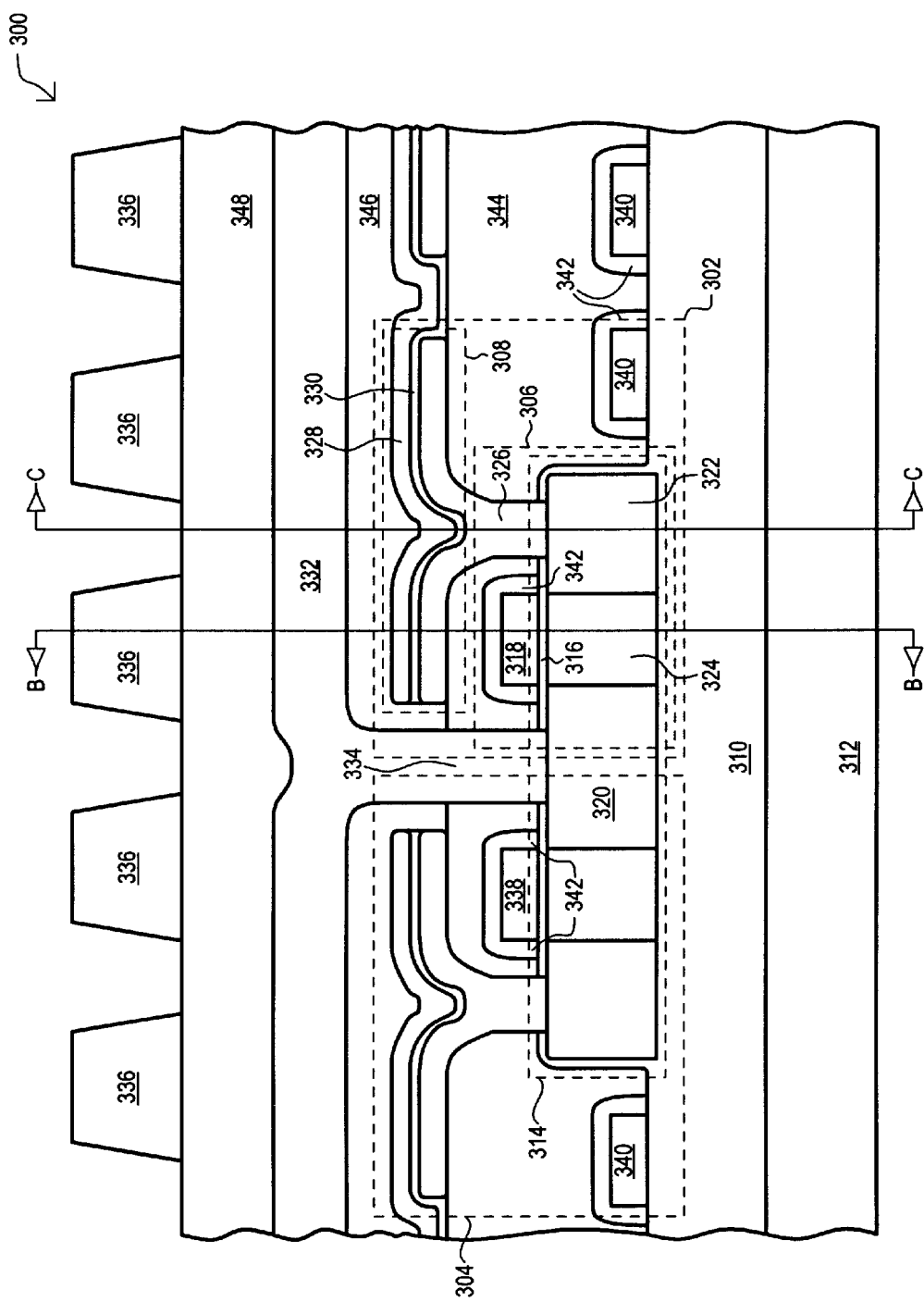
FIG. 3A is a first side cross-sectional view illustrating a DRAM array according to a preferred embodiment.

Referring now to FIG. 3A, a portion of a preferred embodiment DRAM array is set forth in a side cross sectional view. The array is designated by the general reference character 300 and is formed using silicon-oninsulator (SOI) technology. The array 300 is shown to include a first memory cell and a second memory cell, show by the general reference characters 302 and 304, respectively. In the preferred embodiment 300, the second memory cell 304 mirrors the first memory cell 302, therefore only the constituents of the first memory cell 302 will be discussed in detail. The first memory cell 302 includes a pass transistor 306 and storage capacitor 308, both formed on a substrate insulator layer 310. The substrate insulator layer 310 is formed over a monocrystalline semiconductor substrate 312.

The pass transistor 306 is formed within one portion of a silicon mesa 314. A gate insulating layer 316 is disposed on the top surface of the silicon mesa 314, and a control gate 318 is formed on the gate insulating layer 316. The silicon mesa 314 further includes a source region 320, a drain region 322, and a channel region 324. The control gate 318 is situated over the channel region 324 and separated therefrom by the gate insulating layer 316. In the preferred embodiment 300, the width of the channel region 324 is less than that of the source and drain regions (320 and 322). This is best understood with reference to FIGS. 3B and 3C.

Figure 3C:
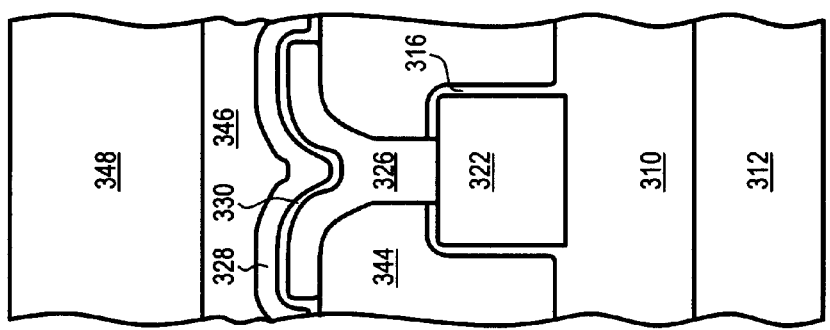
FIG. 3C is a third side cross-sectional view illustrating a DRAM array according to the preferred embodiment.
Figure 3B:
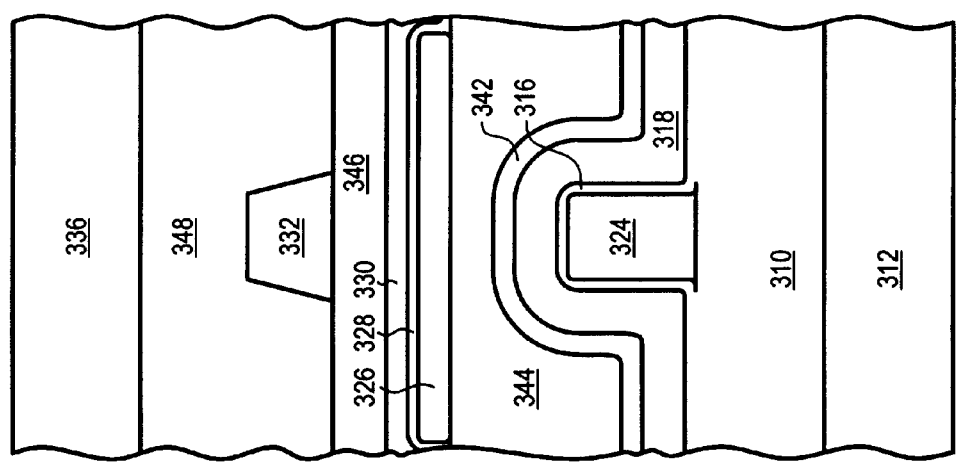
FIG. 3B is a second side cross-sectional view illustrating a DRAM array according to the preferred embodiment.

FIG. 3B is a side cross sectional view taken along the line B—B shown in FIG. 3. The view of FIG. 3B cuts through the channel region 324 in what will be referred to as the "width" direction. This is in contrast to FIG. 3A, which cuts through the channel region 324 in what will be referred to as the "length" direction. FIG. 3C sets forth a second side cross sectional view, parallel to that of FIG. 3B, taken along line C—C of FIG. 3A. FIG. 3C cuts through the drain region 322 in the width direction. If a comparison is made between the channel region 324 of FIG. 3B and the drain region 322 of FIG. 3C, the relatively narrower width of the channel region 324 is evident. It is understood that in the preferred embodiment 300, the source region 320 (not shown in FIG. 3B or 3C) has the same general width as the drain region 322. The channel region 324 can be conceptualized as including a bottom surface that is parallel to the substrate insulator layer 310, and a surface that extends upward from the bottom surface, referred to as a "control" surface. The control surface is so named because the electric field which controls the conductivity of the channel region 324 is applied at the control surface. In the preferred embodiment, the control surface includes a first side surface and second side surface which oppose one another, and are perpendicular to the bottom surface, and a top surface which runs generally parallel to the bottom surface.

Referring once again to FIG. 3B, the gate insulating layer 316 is shown to cover the channel region 324 on three sides with respect to the width direction. The control gate 318, in turn, covers the gate insulating layer 316 in a conformal manner. Thus, the resulting pass transistor 306 (as well as the other pass transistors of the memory array 300) includes a "surrounding" control gate which generates a controlling electric field from not only the top surface of the channel region 324, but a side surface as well. In the preferred embodiment, for even better channel control, the control gate 318 applies the controlling electric field from both side surfaces.

Referring back to FIG. 3A, the storage capacitor 308 is shown to include a storage node 326 and a common plate 328 separated from one another by a capacitor dielectric 330. The drain region 322 of the pass transistor 306 is coupled to the storage capacitor 308 at the storage node 326. The source region 320 of the pass transistor 306 is coupled to a bit line 332 by a bit line contact 334. In the preferred embodiment 300, the source region 320 is shared with the second memory cell 304. Further, the second memory cell 304 includes a drain and channel region formed within the same silicon mesa 314 as the first memory cell 302.

The preferred embodiment 300 also includes a plurality of word line straps 336 disposed above the bit line 332. The word line straps 334 are each coupled to an associated control gate, such as control gate 318. As best illustrated in FIG. 3B, in the preferred embodiment, the word lines straps 336 run parallel to the control gates 318.

In the preferred embodiment 300, the substrate 312 is P-doped monocrystalline silicon formed by boron doping. Alternatively, the substrate 312 can be N-doped monocrystalline silicon formed by phosphorous or arsenic doping. The substrate insulator layer 310 is formed by implanting oxygen into the substrate 312, and then performing an annealing step to form an insulating layer of silicon dioxide ($SiO_2$).

The silicon mesa 314 is created on the substrate insulator layer 310 by first forming a thin layer of monocrystalline silicon using an epitaxial lateral growth, or selective epitaxial growth step. Preferably, the epitaxial silicon has a thickness of about 1500 angstroms. In the preferred embodiment 300, during the epitaxial growth step, monocrystalline silicon is grown over the chip area as a single layer. The epitaxial silicon layer is doped with boron to create a layer of P-type doped epitaxial silicon. Alternatively, P-doped epitaxial silicon could be formed when the epitaxial silicon is first deposited, by in situ doping. In this manner, the basis for SOI structure is created.

Once the basic SOI structure is established, transistor active areas are formed by a pattern and etch step. The pattern and etch step results in a number of isolated silicon mesas (such as silicon mesa 314). The particular shape of the silicon mesas, as well as their position with respect to one another, results in a compact array arrangement. To better understand this aspect of the preferred embodiment, a portion of an array following the formation of the silicon mesas is set forth in an isometric view in FIG. 4. The portion of the array is designated by the reference character 400, and includes one full silicon mesa 402a, as well as portions of four surrounding silicon mesas, shown as 402b–402e. The silicon mesas (402a–402e) are disposed on the substrate insulator layer 404, which in turn, is disposed on the substrate (not shown).

Each of the silicon mesas (402a–402e) includes the same general regions. Like regions, therefore, will be referred to by the same reference character numeral, but end in a letter which designates a particular mesa ("a"–"e"). Thus, each mesa includes a first drain region 406, a first channel region 408, a second drain region 410, a second channel region 412, and a shared source region 414. For example, first drain region 406a is a portion of silicon mesa 402a, while first drain region 406b is a portion of silicon mesa 402b. The shared source regions 414 are "shared" in the sense that the regions function as a source for a first and second transistor, as best illustrated in FIG. 3A.

Referring once again to FIGS. 3A, 3B and 3C, once the isolated silicon mesas (such as 314) are formed, the gate insulating layer 316 is created on the top surface of the silicon mesa 314. The gate insulating layer 316 may be thermally grown $SiO_2$, or alternatively, a combination of a thermally grown $SiO_2$ layer followed by a thin layer of silicon nitride deposited by chemical vapor deposition (CVD).

In order to form the control gate 318, a polysilicon layer is deposited over the gate insulating layer 316. A pattern and etch step is then used to form the control gate 318 above the channel region 324. It is understood that, in the first embodiment memory cell 300, the control gate 318 extends along a portion of, or the entire length of, a memory cell array in the row direction. Thus, the control gate 318 can also be considered as a word line. At the same time control gate 318 is formed, a number of other control gates are also formed. The control gate for the second memory cell 304 is shown as 338. In addition, control gates for adjacent row pairs are shown as 340.

Figure 4:
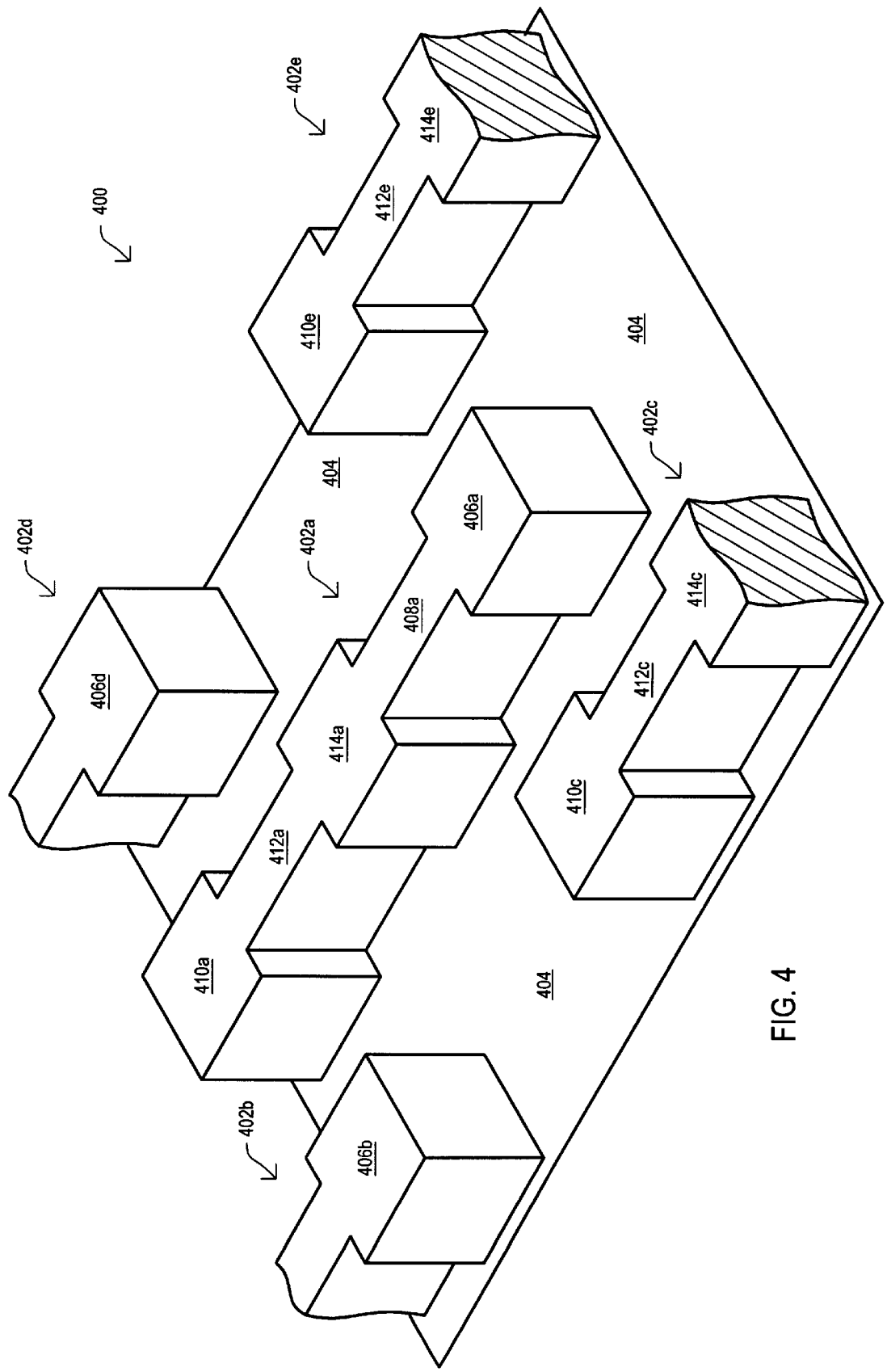
FIG. 4 is an isometric view of a portion of a DRAM array according to the preferred embodiment after the formation of silicon mesas.
Figure 5:
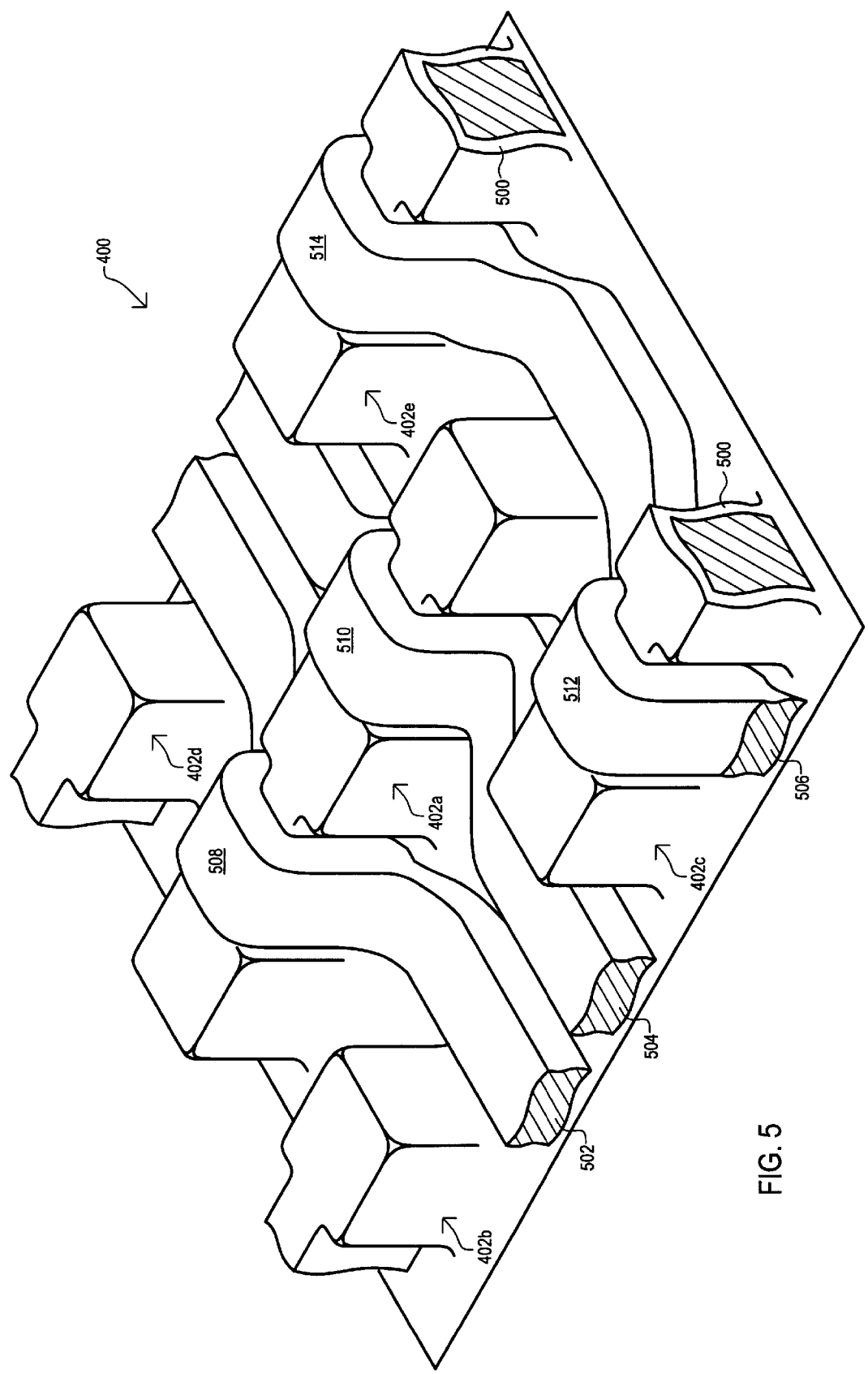
FIG. 5 is an isometric view of a portion of a DRAM array according to the preferred embodiment after the formation of control gates.

The preferred embodiment control gate arrangement is set forth in an isometric view in FIG. 5. FIG. 5 sets forth the same general view of FIG. 4, but following the formation of a gate insulating layer and the control gates. The silicon mesas are identified by the same reference numerals (402a–402e) as FIG. 4. The gate insulating layer is identified by the reference character 500. FIG. 5 also includes three word lines 502, 504 and 506. As noted above, control gates of the preferred embodiment are integral portions of a word line. Thus, word line 502 includes the surrounding control gate 508 for one pass transistor of the silicon mesa 402a, and word line 504 includes the surrounding control gate 510 of the other transistor within silicon mesa 402a. Word line 506 provides a surrounding control gate 512 for silicon mesa 402c, and a surrounding control gate 514 for silicon mesa 402e.

If the silicon mesas (402a–402e) are conceptualized as being arranged in columns, silicon mesas 402b and 402c can be considered as being in a first even column, silicon mesa 402a can be considered as being in an odd column, and silicon mesas 402d and 402e can be considered as being part of a second even column. With this arrangement, the word lines can be considered to be arranged in alternating even and odd pairs, with the odd word line pairs providing control gates for the odd column silicon mesas of its row, while extending between the even column silicon mesas. Conversely, even word line pairs would provide the control gates for even column silicon mesas, and extend between odd column silicon mesas. For example, in FIG. 5, word lines 502 and 504 can be considered as an odd word line pair, as they extend between even column silicon mesas 402b and 402c, provide control gates for odd silicon mesa 402a. The control gates (502 and 504) then go on to extend between even silicon mesas 402d and 402e. Word line 506 is one word line of an even word line pair.

In the preferred embodiment, those silicon mesas in even columns are aligned with one another in the row direction. Similarly, those silicon mesas in the odd columns are aligned with one another in the row direction. However, as shown in FIG. 4, the silicon mesas of the odd columns are offset, or not aligned with, those of the even columns. This arrangement can allow for a more compact array configuration.

Referring yet again to FIGS. 3A, 3B and 3C, once the control gates 318, 338 and 340 are formed, a layer of CVD $SiO_2$ is deposited. The CVD $SiO_2$ is subsequently etched to create oxide "sidewalls" and a "cap" 342 on the sides and top of the control gates (318, 338 and 340). Blanket ion implantation of phosphorous and arsenic is then performed, to create the N-type doping of the drain region 322 and the source region 320. In the preferred embodiment 300, the doping of the drain and source regions (320 and 322) is self-aligned with the control gate 318. It is understood that the doping for the drain and source regions for all of the silicon mesas is self-aligned with respect to the control gates. The blanket implant of phosphorous and arsenic also serves to reduce the resistance of the control gates (318, 338 and 340).

After a thermal annealing step, the control gates (318, 338 and 340), drain region 322, and source region 320, may have their effective resistance reduced with the formation of a self-aligned silicide (salicide). The top of the control gates (318, 338 and 340), and portions of the drain region 322 and source region 320, are exposed by an etch step, followed by the deposition of a metal. An anneal step creates the silicide. Examples of metals that may be used to form silicide include titanium (Ti), platinum (Pt), cobalt (Co) or nickel (Ni).

It is noted that the use of the silicon mesa 314 greatly reduces the source-drain junction capacitance, giving the pass transistor 306 (and hence the memory cell 300 improved performance).

It is also noted, that while the control gates (318, 338 and 340) of the first embodiment 300 are formed from polysilicon, other conductive materials could also be employed. As just one example, tantalum (Ta) may be deposited and etched to form a control gate structure. Such a Ta deposition step could include a sputtering deposition carried out by a dual frequency-excitation process.

A first inter-level dielectric (ILD) 344 is then formed over the control gates (318, 338 and 340). In the first embodiment 300, the first ILD 344 is borophosphosilicate glass (BPSG) deposited by chemical vapor deposition. For increased planarization, and hence improved topography for subsequent fabrication steps, the BPSG is subjected to a reflow step. The BPSG is then subjected to a contact etch to create a contact hole above the drain regions (including drain region 322). A conductive layer is then deposited and subsequently patterned to form the storage nodes (including storage node 326). In the first embodiment 300, the storage nodes may be formed by a low pressure CVD textured, or rugged hemispherical-grain, polysilicon layer. The use of textured or hemispherical-grain polysilicon increases the surface area of the storage node 326, which in turn, will increase the capacitance of the resulting storage capacitor 308. The capacitor dielectric 330 is formed over the storage node 326, and in the first embodiment 300, may be a multi-layered dielectric of $SiO_2/Si_3N_4/SiO_2$ ("ONO"). The ONO capacitor dielectric 330 may be created by the thermal oxidation of the storage node 326, followed by low pressure CVD $Si_3N_4$, and the thermal oxidation of the $Si_3N_4$.

The sharing of the source region 3220 with an adjacent pass transistor, allows for the single silicon mesa 314 to include two pass transistors in a very close proximity to one another. This aspect of the preferred embodiment 300 provides for a compact memory cell arrangement, which can substantially reduce overall DRAM array size.

Once the capacitor dielectric 330 is complete, the common plate 328 is formed over the capacitor dielectric 330 (and over the capacitor dielectrics of other storage capacitors in an array). In the preferred embodiment 300, the common plate 328 is formed from a layer of deposited polysilicon. The common plate polysilicon layer may be doped via ion implantation, or with an in situ technique.

The stacked capacitor provides increased capacitance by extending above and over its associated pass transistor. Thus, the combination of the pass transistor with a low leakage double-gate pass transistor provides a memory cell with and increased capacitance and low leakage characteristics.

While the first embodiment capacitor dielectric 330 is an ONO dielectric film, it may be desirable to use other materials to improve the capacitance or the reliability of the resulting memory cell. One such material may be a dual layer film of $SiO_2/Si_3N_4$ (ON). Yet another example could include a single layer film of $SiO_2$. The use of $SiO_2$ would give less capacitance per area, given the same thickness as the ONO dielectric film. Because tunneling across the capacitor dielectric 330 may represent a significant amount of leakage for very thin capacitor dielectrics, another alternative approach to forming the capacitor dielectric 330 could include the rapid thermal nitridation of the storage node 326, prior to the chemical vapor deposition of the $Si_3N_4$. It may also be desirable to perform an in situ surface cleaning of the native polysilicon storage node 326 layer before the rapid thermal nitridation, with the remaining capacitor dielectric formation steps being carried out in an identical chamber process.

Materials having a dielectric constant greater than that of silicon oxide and/or silicon nitride may also be employed, to increase the capacitance of the storage capacitor 308. As just one example, a tantalum pentoxide ($Ta_2O_5$) film may be formed over the storage node 326. This may be accomplished by low-pressure or plasma enhanced chemical vapor deposition followed by a high temperature anneal step. In addition, it noted that the storage node 326 surface may be treated by rapid thermal nitridation in $NH_3$ prior to the deposition of $Ta_2O_5$. Other high dielectric materials that may be employed as capacitor dielectrics include epitaxially grown $SrTiO_3$ (strontium titanium oxide), $BaSrTiO_3$ (barium strontium titanium oxide), or PZT (lead zirconate titanium).

It is also understood that while the first embodiment 300 includes a storage node 326 and common plate 328 formed from polysilicon, other conductive materials could be employed. For example, titanium-nitride (TiN) or aluminum (Al) may be used to form the common plate 328. Alternatively, a multi-layered material, such as a TiN/polysilicon material could be used to form the common plate 328.

A second ILD 346 is formed over the completed storage capacitors of the array. The second ILD 346 is subjected to a contact etch step, which results in a contact hole that extends through an opening in the common plate 328, the first ILD 344, and the gate insulating layer 316 to the source region 320. The contact hole is filled with a conductive material to create the bit line contact 334. In the preferred embodiment 300, the contact hole is filled with tungsten (W), to form a tungsten "plug." A chemical mechanical polishing (CMP) step can then be used to planarize the surface.

Once the bit line contact 334 is formed, a conductive layer is then deposited on the planarized second ILD 346 surface, that makes contact with the bit line contact 334. The conductive layer is subsequently etched to form the bit line 332. In the preferred embodiment 300, the bit line 332 is formed from titanium-tungsten (TiW), and serves to commonly couple a column of identical memory cells.

Referring back to FIG. 5, it is understood that the bit lines would run perpendicular to the word lines (502, 504 and 506), with a bit line being commonly coupled to each column of odd or even silicon mesas. That is, one bit line would be commonly coupled to silicon mesas 402b and 402c, an adjacent bit line would be coupled to silicon mesa 402a, and a bit line adjacent to that, would be coupled to silicon mesas 402d and 402e.

A third ILD 348 is deposited over the bit line 332. The third ILD 348 is then etched to create strapping contact holes (not shown) which extend through the first, second and third ILDs (344, 346 and 348) to the control gates (including 318, 338 and 340). The strapping contact holes are filled with a conductive material to form strapping vias. The strapping vias could be formed from, as just one example, a W plug.

A conductive layer is then deposited on the third ILD 348, making contact with the strapping vias. The deposited conductive layer is then etched to form the word line straps 336.

The use of a channel regions having a reduced width and surrounding control gate has the advantage of reducing the leakage current from the drain region 322 to the source region 320 by providing increased control over the electric field in the channel region 324. This aspect of the preferred embodiment 300 is particularly advantageous when employed in a DRAM memory cell. By reducing the leakage current drawn between the source region 320 and the drain region 322, charge can be retained for a relatively long period of time on the storage capacitor 308. This can result in considerable power savings in the operation of DRAM, allowing the DRAM to go for a longer period of time before a refresh operation is required. At the same time, the reduced size of the pass transistor 306 can allow for array configurations of increased density.

In alternative embodiments, the bit line 332 and word line strap 336 may be composed of metals such as Al, cladded by refractory metals combinations, such as TiN or TiW. Furthermore, the Al layer may include a small percentage of silicon (Si) to reduce contact spiking. Alternatively, the bit line 332 and word line strap 336 may be copper (Cu) based and constructed by electrolytically plating the Cu into trenches etched into the $SiO_2$, followed by a CMP step.

It is understood, that although the memory cells (302 and 304) in FIG. 3 are shown to be "capacitor-under-bit line" stacked cell structures, a "capacitor-over-bit line" (COB) stacked cell structure may also be implemented with mesa structures disclosed. Such a structure would be created by forming the bit line contact 334 and bit line 332, before forming the storage capacitor 308. For example, after the deposition of the first ILD 344, instead of etching a hole to the drain region 322, a bit line contact hole could be etched to the source region 320. The bit line contact 334 would then be formed within the resulting hole. A planarization step (such as CMP) could follow, and a conductive layer could be deposited and etched to form the bit line 332. Thus, in the COB-type embodiment, the bit line 332 is situated on, and the bit line contact 334 extends through, the first ILD 344 instead of the first and second ILDs (346 and 348).

Following the initial formation of the bit line contact and bit line, the creation of the COB-type variation could then continue with the deposition of the second ILD 346. This layer could then be planarized by a CMP step. A storage node hole would then be etched through the first and second ILDs (346 and 344) to the drain region 322. The storage node 326 would then be formed within the storage node hole, and the capacitor dielectric 330 and common plate 328 formed as previously described. The third ILD 348 is then formed over the storage capacitor 308. The word line strapping arrangement can then be formed as previously described.

It is also understood that the storage capacitor of the DRAM cell may be implemented in the form of a trench capacitor. In such an arrangement, following the formation of the pass transistor, an anisotropic reactive ion etch can be used to form a trench in contact with, or adjacent to the drain regions. The storage node, capacitor dielectric and common plate can then be formed within the trench to create a trench-type storage capacitor.

A DRAM array according to the preferred embodiment could include a strip, running parallel to the column direction within the array, that is void of memory cells (a "strapping area"). The strapping area can serve as a location for the strapping vias. This arrangement allows word line connections within the array to be made in a single strip in a column-wise direction, so that the remainder of the array (particularly those portions having memory cells) can have a compact configuration.

Figure 1:
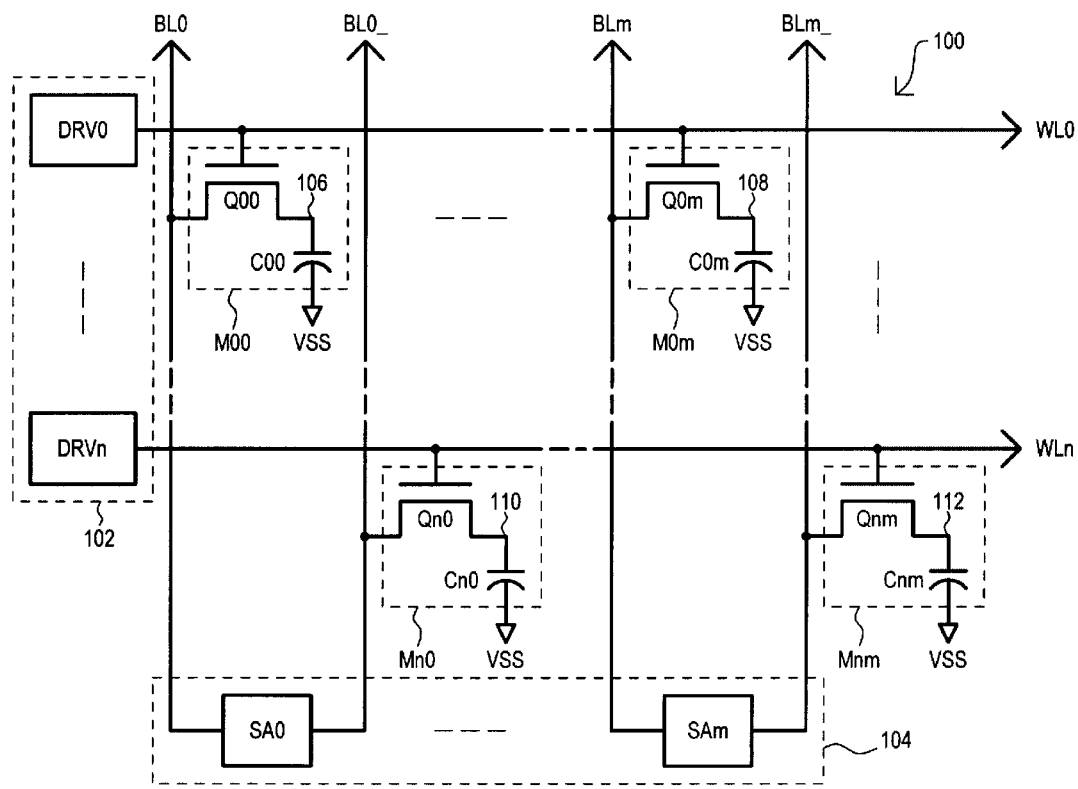
FIG. 1 is a block schematic diagram of a prior art DRAM array.
Figure 2:
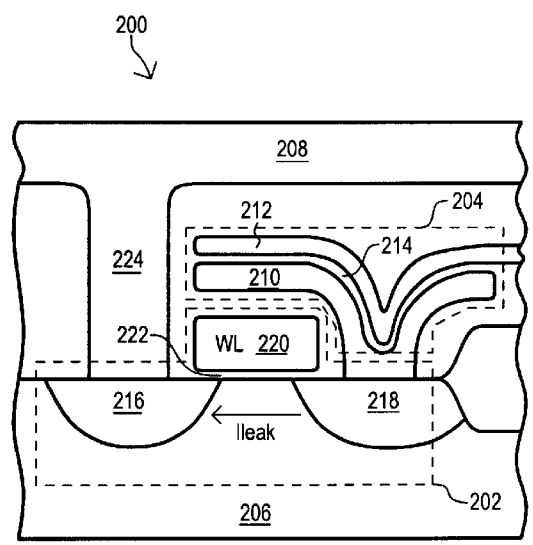
FIG. 2 is a side cross-sectional view of a prior art DRAM cell.
Figure 6:
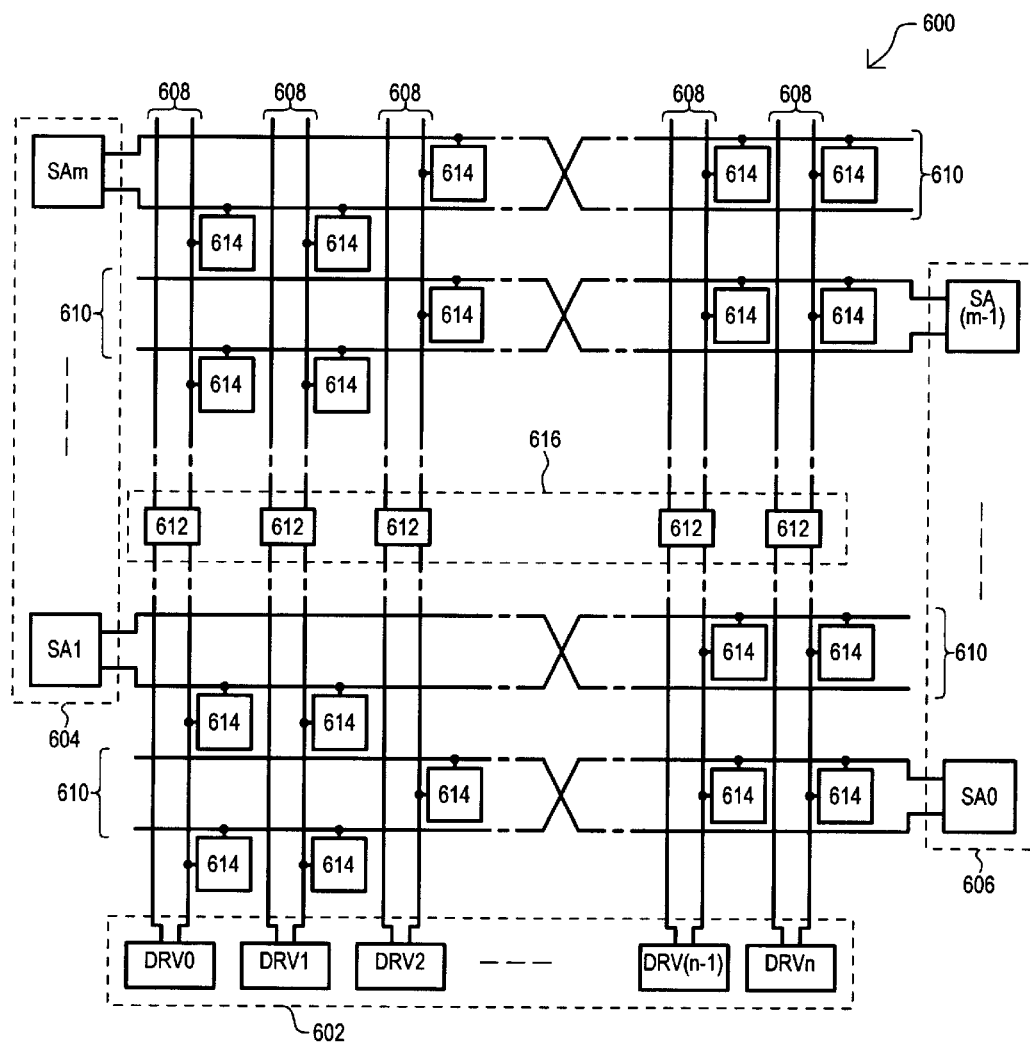
FIG. 6 is a block schematic diagram illustrating a DRAM array according to the preferred embodiment.

Referring now to FIG. 6, a block schematic is set forth, illustrating a DRAM array according to the preferred embodiment. The DRAM array includes a plurality of DRAM cells, having the general arrangement illustrated in FIGS. 3A–3C, 4 and 5. The memory array is designated by the general reference character 600, and includes a word line driver section 602, a left sense amplifier section 604, a right sense amplifier section 606, a plurality of word lines 608, a plurality of bit line pairs 610, and a plurality of word line strap structures 612. The memory cells 614 are formed at the intersection of bit lines 610 and the word lines 608. The word line driver section 602 contains a word line driver (DRV0–DRVn) corresponding to each word line 608 in the memory array 600. Each word line driver (DRV0–DRVn) drives a word line and a word line strap. Because a word line strap is used in conjunction with a word line, the capacitive load presented by each word line 608 may require a word line driver (DRV0–DRVn) having a drive strength that is greater than that of the prior art word line drivers set forth in FIG. 1.

Figure 7:
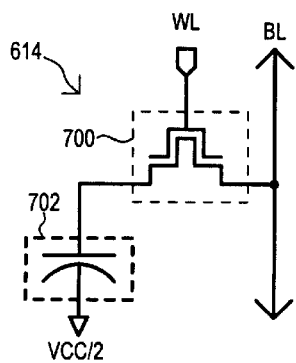
FIG. 7 is a schematic diagram of a memory cell of the preferred embodiment DRAM array of FIG. 6.

Referring now to FIG. 7, a schematic diagram of a memory cell is set forth in detail. The memory cell is designated by the general reference character 614, and includes a pass transistor 700 having a reduced width channel region and surrounding gate, and a storage capacitor 702.

As noted above, each polysilicon word line is strapped to a metal word line strap to reduce the effective resistance of the word lines 608 and improve the speed of the memory. The word line strap connection occurs at the word line strap structures 612, which are evenly spaced along the length of the word lines 608. In the preferred embodiment array 600, the word line strapping structures 612 are aligned with one another in the bit line direction, resulting in the formation of a column of word line straps 616. The column of word line straps 616 is void of memory cells, providing sufficient room for the placement of strapping vias. The frequency of word line strap columns 616 within the array 600 is dependent upon the desired effective resistance of the word lines in the memory array.

Figure 8:
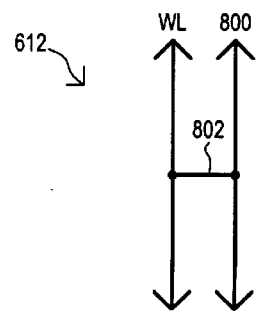
FIG. 8 is a schematic diagram of a word line strap structure of the preferred embodiment DRAM array of FIG. 6.

FIG. 8 sets forth a schematic representation of a word line strapping structure of the preferred embodiment array 600. The word line strapping structure is designated by the general reference character 612 and is shown to include a word line WL and a word line strap 800. The word line is shown to be coupled to the word line strap 800 by a strapping via 802.

If reference is made to FIG. 8 in conjunction with FIGS. 3A–3C, the word line strap 800 of FIG. 8 corresponds to the word line straps 336 of FIGS. 3A and 3B. As such, in the preferred embodiment 600, the word line strap layer 800 is a metal, such as Al. The word line (WL) of FIG. 8 corresponds with the control gates (318, 338 and 340) of FIGS. 3A and 3B, and is formed from polysilicon. As was previously noted, the function of the word line strapping structure 612 is to reduce the effective resistance of the word lines.

Referring once again to FIG. 6, the left sense amplifier section 604 and the right sense amplifier section 606 are shown to be disposed on opposite sides of the array 600. In order to access every memory cell 614 within array 600, it is necessary to have a sense amplifier for every pair of bit lines 610 in the memory array 600. Because there are two sense amplifier sections (604 and 606), half of the sense amplifiers are in the left sense amplifier section 604, and the other half are in the right sense amplifier section 606. This arrangement allows for greater "pitch" (area in the column direction) per sense amplifier, making the layout of the sense amplifiers more efficient. The left sense amplifier section 604 can be considered to be coupled to the odd pairs of bit lines 610, thus the sense amplifiers within are designated by odd numbers (SA1, SA3, SA5 . . . SAm). The right sense amp section 606 can be considered to be coupled to the even pairs of bit lines 610, and so includes sense amplifiers having an even number designation (SA0, SA2, SA4 . . . SA(m−1)).

As set forth in FIG. 6, in the preferred embodiment 600, the pairs of bit lines 610 are "twisted" at their midpoint. This arrangement results in any noise on the bit lines being common mode noise. Noise sources can include signals coupled to the bit lines from parallel lines running above or below (for example y-select lines—not shown in FIG. 6). The sense amplifiers (SA0–SAm) of the preferred embodiment 600 have high common mode rejection ratios, thus the common coupled noise is less likely to result in noise induced sensing errors.

The preferred embodiment array 600 can form part of a DRAM memory device. Such a device would also include a periphery area. While the array 600 would include NMOS devices, the periphery could include the logic and decoding circuits, formed with complementary metal(conductor)-oxide(insulator)-semiconductor (CMOS) technology. The CMOS devices could include conventional (i.e., source, drain and channel regions of equal width) transistors. Alternatively, the preferred embodiment array 600 could be implemented as an integrated memory in a larger function semiconductor device.

Although the present invention has been described in terms of a detailed preferred embodiment, it should be understood that various changes, substitutions, and alterations could be made without departing from the spirit and scope of the invention as defined by the appended claims.

What is claimed is:

1. A semiconductor memory device, comprising:

a first bit line; and a first memory cell including a first storage capacitor, and a first pass transistor formed within a semiconductor mesa, the semiconductor mesa extending in length direction and a width direction and being coupled between the first bit line and the first storage capacitor, the first pass transistor including, a source region coupled to the first bit line, the first source region having a source width in the width direction, a first drain region coupled to the first storage capacitor, the first drain region having a drain width in the width direction, a first channel region disposed between the source region and the first drain region in the length direction, the first channel region having a first channel width along the width direction, the first channel width being less than the source region width, the first channel region having at least one generally horizontal first channel top surface, and at least one generally vertical first channel first side surface, and a first control gate disposed adjacent to the first channel top surface and first channel first side surface, and separated therefrom by a first gate insulating layer.

2. The semiconductor memory device of claim 1, wherein:

the first channel region further includes a generally vertical first channel second side surface, and the first control gate is disposed adjacent to the first channel second side surface, and separated therefrom by the first gate insulating layer.

3. The semiconductor memory device of claim 1, wherein:

the first storage capacitor includes
a first storage node coupled to the first pass transistor,
a first capacitor dielectric formed on the first storage node, and
a first top plate formed over the first capacitor dielectric.

4. The semiconductor memory device of claim 3, wherein:

a second memory cell including
a second storage capacitor, and
a second pass transistor formed within the semiconductor mesa, the second pass transistor including,
the source region,
a second drain region coupled to the second storage capacitor,
a second channel region disposed between the source region and the second drain region in the length direction, the second channel region having a second channel width along the width direction that is less than the source region width, the second channel region having at least one generally horizontal second channel top surface, and at least one generally vertical second channel first side surface, and
a second control gate disposed adjacent to the second channel top surface and second channel first side surface, and separated therefrom by a first gate insulating layer.

5. The semiconductor memory device of claim 4, wherein:

the second storage capacitor includes
a second storage node coupled to the second pass transistor,
a second capacitor dielectric formed on the second storage node, and
the first top plate formed over the second capacitor dielectric.

6. The semiconductor memory device of claim 4, further including:

a sense amplifier coupled to the first bit line, the sense amplifier sensing the data stored in the first memory cell when the first memory cell is selected by activation of the first control gate, and sensing data in the second memory cell when the second memory cell is selected by activation of the second control gate.

7. The semiconductor memory device of claim 6, further including:

a second bit line coupled to the sense amplifier; and
the first bit line and the second bit line form a twisted bit line pair.

8. The semiconductor memory device of claim 4, wherein:

the semiconductor mesa is formed from a first conductivity type, the source region, first drain region, and second drain region are formed from a second conductivity type.

9. The semiconductor memory device of claim 8, wherein:

the conductivity of the source region, first drain region, and second drain region is established by doping, and the doping of the source region, first drain region, and second drain region is self-aligned with respect to the first control gate and the second control gate.

10. The semiconductor memory device of claim 8, wherein:

the semiconductor mesa includes monocrystalline silicon.

11. The semiconductor memory device of claim 1, further including:

a word line driver coupled to the control first gate.

12. The semiconductor memory device of claim 11, further including:

a word line strap coupled to the word line driver and to the first control gate, the word line strap being formed from a conductive material having a lower resistance than the first control gate.

13. A dynamic random access memory cell, comprising:

a storage capacitor; and
a pass transistor formed on an insulating layer, the pass transistor including
a source region having a source width along a width direction,
a drain region having a drain width along the width direction,
a channel region extending between the source region and the drain region, generally perpendicular to the width direction, the channel region having a channel width along the width direction that is less than the drain width, the channel region being defined in the width direction by a bottom surface disposed on the insulating surface and a control surface that extends upward from the bottom surface,
a first gate insulating layer formed on the control surface of the channel region, and
a first surrounding gate formed over at least a portion of the control surface, and being separated therefrom by the first gate insulating layer.

14. The semiconductor memory device of claim 13, wherein:

the control surface of the channel region includes a generally vertical channel first side surface, a generally horizontal channel top surface, and a generally vertical channel second side surface.

15. The semiconductor memory device of claim 14, wherein:

the first surrounding gate is formed over the channel first side surface and channel top surface.

16. The semiconductor memory device of claim 15, wherein:

the first surrounding gate is further formed over the channel second side surface.

17. The semiconductor memory device of claim 13, wherein:

the first gate insulating layer includes thermally grown silicon dioxide.

18. The semiconductor memory device of claim 13, wherein:

the source region, drain region and channel region are integral portions of a semiconductor mesa structure.

19. The semiconductor memory device of claim 18, wherein:

the semiconductor mesa includes monocrystalline silicon formed on a substrate insulating layer.

20. The semiconductor memory device of claim 19, wherein:
the substrate insulating layer includes silicon dioxide.

21. The semiconductor memory device of claim 13, wherein:
the first surrounding gate includes polysilicon.

22. A dynamic random access memory array, comprising:
a plurality of memory cells, arranged into a plurality of generally parallel rows, each memory cell including
a pass transistor having
a source region formed within a silicon mesa disposed on a substrate insulating layer,
a drain region formed within the silicon mesa,
a channel region formed within the silicon mesa between the source region and the drain region, the channel region including a control surface having at least a first side surface that extends generally upward from the substrate insulating layer,
a control gate formed over the control surface of the channel region, and separated therefrom by a gate insulating layer, and
a storage capacitor coupled to the drain region, the storage capacitor including
a storage node coupled to, and extending over the drain region,
a capacitor dielectric formed over the storage node, and
a common plate formed over the storage nodes of a plurality of memory cells; and
a word line associated with each row, each word line being coupled to the first gates of the memory cells within its respective row.

23. The dynamic random access memory array of claim 22, wherein:
the control surface of the channel region further includes a top surface that is generally parallel to the substrate insulating layer.

24. The dynamic random access memory array of claim 23, wherein:
the control surface of the channel region further includes a second side surface that extends generally upward from the substrate insulating layer, the top surface being disposed between the first side surface and the second side surface.

25. The dynamic random access memory array of claim 22, wherein:
the first side surface of the channel region is generally perpendicular to the substrate insulating layer.

26. The dynamic random access memory array of claim 22, wherein:
the control gates of the transistors within each row are integral portions of the word line of that row.

27. The dynamic random access memory array of claim 26, wherein:
the word lines include polysilicon.

28. The dynamic random access memory array of claim 22, further including:
a word line strap associated with each row, each word line strap being disposed generally parallel to the word line of its associated row, and coupled thereto by at least one strap via.

29. The dynamic random access memory array of claim 28, wherein:
the word line straps include a metal layer.

30. The dynamic random access memory array of claim 22, further including:
the memory cells being further arranged into a plurality of columns that are generally perpendicular to the rows, at least one pair of adjacent columns being separated by a strapping area;
a word line strap associated with each row, each word line strap being disposed generally parallel to the word line of its associated row, and coupled thereto by at least one strap via; and
the word lines and word line straps extend across the strapping area, and the strap vias are located within the strapping area.

31. The dynamic random access memory array of claim 22, wherein:
the memory cells are further arranged into a plurality of columns arranged in a column direction that is generally perpendicular to the rows, each of the columns including a plurality of semiconductor mesas aligned in the column direction, each semiconductor mesa including two of the pass transistors, each pass transistor within a mesa having a drain region, channel region, and sharing a common source region.

32. The dynamic random access memory array of claim 31, wherein:
the columns are arranged into alternating even columns and odd columns, the silicon mesas of the even columns being aligned with one another in the row direction, the silicon mesas of the odd columns being aligned with one another in the row direction, the silicon mesas of the even columns being offset from silicon mesas of the odd columns with respect to the row direction.

33. The dynamic random access memory array of claim 32, wherein:
the channel region is disposed between the source region and the drain region in a length direction, and
the column direction is parallel to the length direction.

34. The dynamic random access memory array of claim 22, wherein:
the channel region is disposed between the source region and the drain region in a length direction and includes a channel width that is generally perpendicular to the length direction,
the source region includes a source width that is generally perpendicular to the length direction, the source width being greater than the channel width.

35. The dynamic random access memory array of claim 22, wherein:
the channel region is disposed between the source region and the drain region in a length direction and includes a channel width that is generally perpendicular to the length direction,
the drain region includes a drain width that is generally perpendicular to the length direction, the drain width being greater than the channel width.

* * * * *